United States Patent
Zdrojek et al.

(10) Patent No.: US 11,766,854 B2
(45) Date of Patent: Sep. 26, 2023

(54) COMPOSITE MATERIAL FOR SHIELDING ELECTROMAGNETIC RADIATION, RAW MATERIAL FOR ADDITIVE MANUFACTURING METHODS AND A PRODUCT COMPRISING THE COMPOSITE MATERIAL, AS WELL AS A METHOD OF MANUFACTURING THE PRODUCT

(71) Applicant: NanoEMI sp. z o.o., Lublin (PL)

(72) Inventors: Mariusz Zdrojek, Warsaw (PL); Jaroslaw Judek, Warsaw (PL); Krzysztof Jakubczak, Grodzisk Mazowiecki (PL); Anna Duzynska, Warsaw (PL); Klaudia Zeranska-Chudek, Warsaw (PL); Anna Wroblewska, Lajski (PL); Anna Lapinska, Warsaw (PL)

(73) Assignee: NANOEMI SP. Z.O.O., Lublin (PL)

( * ) Notice: Subject to any disclaimer, the term of this patent is extended or adjusted under 35 U.S.C. 154(b) by 494 days.

(21) Appl. No.: 16/803,511

(22) Filed: Feb. 27, 2020

(65) Prior Publication Data
US 2020/0276797 A1 Sep. 3, 2020

(30) Foreign Application Priority Data
Feb. 28, 2019 (EP) .................................. 19461516

(51) Int. Cl.
C08K 3/22 (2006.01)
B32B 33/00 (2006.01)
C01B 32/182 (2017.01)
B32B 27/08 (2006.01)
C08K 3/04 (2006.01)
B33Y 70/10 (2020.01)

(52) U.S. Cl.
CPC .............. *B32B 33/00* (2013.01); *B32B 27/08* (2013.01); *B33Y 70/10* (2020.01); *C01B 32/182* (2017.08); *C08K 3/042* (2017.05); *C08K 3/22* (2013.01); *B32B 2274/00* (2013.01); *B32B 2307/212* (2013.01); *C08K 2201/011* (2013.01)

(58) Field of Classification Search
CPC ..... B32B 33/00; B32B 27/08; B32B 2274/00; B32B 2307/212; B33Y 70/10; B33Y 70/00; C01B 32/182; C08K 3/042; C08K 3/22; C08K 2201/011; C08K 13/04; C08K 7/00; C08K 3/10; C08K 5/0016; C08K 5/005; C08K 5/05; C08K 5/09; H05K 9/0083; H05K 9/0081; G12B 17/02
USPC ...................................................... 524/847
See application file for complete search history.

(56) References Cited

U.S. PATENT DOCUMENTS

| | | |
|---|---|---|
| 8,610,617 B1 | 12/2013 | Avouris et al. |
| 9,215,835 B2 | 12/2015 | Avouris et al. |
| 2005/0098916 A1* | 5/2005 | Umetsu .................. B29B 11/12 264/118 |
| 2006/0083948 A1 | 4/2006 | Kawaguchi et al. |
| 2013/0105069 A1* | 5/2013 | Van Nutt ................ B32B 37/14 156/247 |
| 2013/0140076 A1 | 6/2013 | Lee et al. |
| 2013/0264511 A1 | 10/2013 | Choi et al. |
| 2014/0187413 A1* | 7/2014 | Lagaron Cabello .... C01B 33/38 502/80 |
| 2014/0238736 A1 | 8/2014 | Youm et al. |
| 2016/0276056 A1* | 9/2016 | Stolyarov ............... B29C 64/40 |
| 2022/0250915 A1* | 8/2022 | Duzynska ............... C01B 32/19 |

FOREIGN PATENT DOCUMENTS

| | | |
|---|---|---|
| CN | 103232637 A | 8/2013 |
| CN | 104650498 A | 5/2015 |
| PL | 223793 B1 | 5/2015 |
| WO | 2018081394 A1 | 5/2018 |
| WO | 2019112449 A1 | 6/2019 |

OTHER PUBLICATIONS

Multiwall Carbon Nanotubes; Technical Data Sheet; NC7000; Jul. 12, 2016; Nanocyl S.A.
Seo, et al.; "Terahertz electromagnetic interference shielding using single-walled carbon nanotube flexible films" Applied Physics Letters; 2008.
Das, et al.; "Design and synthesis of superhydrophobic carbon nanofiber composite coatings for terahertz frequency shielding and attenuation"; Applied Physical Letters 98; 2011.
Al-Saleh, et al; "Electromagnetic interference shielding mechanisms of CNT Polymer composites"; Science Direct; Carbon 47; Canada; 2008.
Kumar, et al; "Large-area reduced graphene oxide thin film with excellent thermal conductivity and electromagnetic interference shielding effectives" Carbon 94; Korea 2015.
Al-Saleh, et al; "Copper Nonowire/polystyrene nano composites: lower percolation threshold and higher EMI shielding"; Composites: Part A; Canada; 2010.
Lin, et al; Electrical and mechanical properties of electrically conductive polyethersulfone composites; 1991; New York; US.
Fang, et al.; "Layer-structured silver nanowire/polyanilive composite film as a high performance X-band EMI shielding material"; Journal of Materials Chemistry C; Apr. 2016.
Song, et al; "Magnetic and conductive graphene papers toward thin layers of effective electromagnetic shielding" Journal of Materials Chemistry A; 2015.

(Continued)

*Primary Examiner* — Hannah J Pak
(74) *Attorney, Agent, or Firm* — Dickinson Wright PLLC; Andrew D. Dorisio

(57) ABSTRACT

The invention relates to a composite material for shielding electromagnetic radiation, a raw material for additive manufacturing methods and a product comprising the material as well as a method of manufacturing the product. The composite material according to the invention can serve as a material protecting electronic elements, electronic devices or living organisms from electromagnetic radiation in the microwave and terahertz range (0.3-10000 GHz).

13 Claims, 2 Drawing Sheets

(56) References Cited

OTHER PUBLICATIONS

Yan, et al; "Efficient electromagnetic interference shielding of lightweight/graphene/polystyrene composite"; Journal of Materials Chemistry; 2012.
Gelves, et al; "Highly electrically conductive and high performance EMI shielding nanowire/polymere nanocomposites by miscible mixing and precipitation"; Journal of Materials Chemistry; 2010.
Gargama, et al.; "Polyvinylidene flouride/nickel composite materials for charge storing electromagnetic interference absorption and shielding application"; Journal of Applied Physics; 2015.
Yang, et al.; "Novel Carbon Nanotube-Polystyrene Foam Composites for Electromagnetic Interference Shielding" Nanoletters; University of Virginia; 2005.
Yan, et al; "Electromagnetic interference shielding of segregated polymer composite with an ultralow loading in situ thermally reduced graphene oxide"; Sichuan University; China; 2014.
Shahzad, et al; "Electromagnetic interference shielding with 2D transition metal carbides (MXenes)"; Materials Science, vol. 353, Issue 6304; Sep. 9, 2016.

\* cited by examiner

COMPOSITE MATERIAL FOR SHIELDING ELECTROMAGNETIC RADIATION, RAW MATERIAL FOR ADDITIVE MANUFACTURING METHODS AND A PRODUCT COMPRISING THE COMPOSITE MATERIAL, AS WELL AS A METHOD OF MANUFACTURING THE PRODUCT

The disclosure of European Patent Application EP19461516.7, filed Feb. 28, 2019, is incorporated herein by reference.

FIELD OF THE INVENTION

The object of the invention is a composite material for shielding electromagnetic radiation, a raw material for additive manufacturing methods and a product comprising the material as well as a method of manufacturing the product. The composite material according to the invention can serve as a material protecting electronic elements, electronic devices or living organisms from electromagnetic radiation in the microwave and terahertz range (0.3-10000 GHz).

BACKGROUND

Currently, the surrounding environment is more and more filled with all kinds of electromagnetic radiation, mainly in the range of radio and microwave waves, but also increasingly in the terahertz range of 100-0.03 mm, usually defined in the frequency range of 0.3-10000 GHz. This radiation may have a negative impact on both the operation of electronic devices and living organisms, including humans. The following examples can be given: failure of medical equipment monitoring signals of the human body, mass transit systems or air/car transport suffering from the failure of sensitive electrical devices, interference in audio/video/GPS signals in various telecommunications systems. Therefore, there is a need for effective blocking of or shielding this type of radiation, which is extremely important in many industries and for ordinary consumers. This problem is usually defined as electromagnetic interference (EMI). The EMI problem can be solved using a shield and can be physically realised by absorbing and/or reflecting electromagnetic radiation by a material which acts like a shield. The relationship between shielding effectiveness (in units of dB) and shielding efficiency in % is following: effectiveness of 10 dB means that 90% of the incident electromagnetic radiation power is stopped by the material. Going further, by analogy: 20 dB-99%, 30 dB-99.9%, 40 dB-99.99%, 50 dB-99.999%, 60 dB-99.9999%.

Currently, metal is the most commonly used shielding material. It is, however, a non-selective material which simultaneously shields electromagnetic radiation in a very wide range of the spectrum, including the microwave and terahertz range. It is noteworthy that metal is a material which mainly reflects and does not absorb radiation. Furthermore, metal cannot always be used due to the fact that it is an electrically conductive material, poorly plastic and inflexible and usually has a high specific gravity.

Other materials that can be used as shields of electromagnetic radiation are also considered in the literature. Conductive polymer composites with metal fillers are known, which can be used as EMI shielding materials, like a composite filled with aluminium or stainless steel flakes (up to 40%), characterised by shielding effectiveness higher than 50 dB (Composites 25, 215, 1994). It has been proven that mixing aluminium powder with a PVDF polymer, followed by hot pressing gives a shielding composite in the range of 8-12 GHz at the level of ~20 dB (Journal of Applied Physics 117, 224903 2015). Composites containing silver nanowires (<14 vol. %) as a filler, produced by instillation, also exhibit shielding properties (50 dB, 8-12 GHz) (J. Mater. Chem. C 4,419, 2016). In Gelves et al. (J. Mater. Chem. 21, 829, 2011) a 200 μm thick composite made of polystyrene and silver nanowires (<3% by volume) was produced, showing electrical conductivity of $10^4$ S/m and shielding efficiency exceeding 20 dB in the 8-12 GHz range. In the publication "Composites Part A: Applied Science and Manufacturing" (2011) copper nanowires were used, which at the content of 2% (vol.) in polystyrene gave more than 30 dB of shielding efficiency. In both cases the composite was prepared by dry direct mixing of the ingredients at room temperature, and then the obtained powder was melted. These examples of composites with metallic fillers are electrically conductive in the direct current (DC) range, and the shielding mechanism is based on the existence of metallic paths in the material.

The material absorbing electromagnetic radiation in the microwave range is carbon as such in various forms: graphite, carbon nanotubes and graphene. Graphene is a carbon allotrope with a two-dimensional hexagonal structure. In turn, carbon nanotubes consist of one or more graphene monolayers rolled up in the shape of coaxial cylinders with diameters of 0.5 to several dozen nanometres and lengths up to several centimetres. For example, thin and large surface layers of reduced graphene oxide, forming a laminate with a thickness of 10 μm, have a shielding ability of 20 dB in the 1-4 GHz range (Carbon 94, 494, 2015). Another example is thin graphene layers with an admixture of magnetic nanoparticles, e.g. $Fe_3O_4$, prepared by filtration from a suspension with an admixture of ferrites. These layers achieved a shielding effectiveness of ~20 dB in the 8-12 GHz range (J. Mater. Chem. A 3, 2097, 2015). These materials are electrically conductive in the DC range, and the shielding mechanism is based on the existence of metallic paths in the material.

Polymer composites with nanocarbon fillers having shielding properties are also known, such as a composite containing an admixture of multi-wall carbon nanotubes in a polypropylene matrix. The composite has shielding properties in the range of 8-12 GHz at the level of 30 dB at an admixture concentration of ~7%. The composite was prepared by dry direct mixing of the ingredients at room temperature, and then the obtained powder was melted and compressed into thin plates (Carbon 47, 1738, 2009). The composite is conductive in the DC range.

A foam composite based on polystyrene and carbon nanotubes is also known, exhibiting a shielding property in the range of 8-12 GHz reaching almost 20 dB. The composite was prepared by mixing the filler in a solution of toluene with polystyrene containing a foaming agent and by spraying the suspension mixed in this manner, wherein in the next stage the foam concentrate was removed hot (Nano Letters 11, 2131, 2005). The composite is conductive in the DC range.

Various forms of graphene are also used in polymer composites as fillers, acting as an active element shielding electromagnetic radiation. For example, a porous composite is known, which consists of polystyrene and functionalised graphene (up to 30% by weight) and exhibits a shielding efficiency up to 30 dB in the 8-12 GHz range. The composite was prepared by direct mixing of ingredients and hot pressing and by using a process that forms a porous structure (J. Mater. Chem., 22, 18772, 2012). The composite is conductive in the DC range.

A method for producing a conductive (in the DC range) composite based on thermally reduced graphene oxide, achieving a shielding ability of 30 dB at low filler concentration (<1%) is also known. The composite was prepared by mechanical mixing of graphene oxide and polyethylene granules which were then subjected to hot compression. Importantly, this process resulted in simultaneous reduction of graphene oxide (Nanotechnology 25, 145705, 2014).

Polymeric materials with an admixture of two-dimensional structures of carbides/nitrides of rare earth metals are also disclosed. The use of $Ti_3C_2T_x$, $Mo_2TiC_2T_x$, $Mo_2Ti_2C_3T_x$ structures in form of thin layers and polymer composites (sodium aluminate) produced from the suspensions of these compounds by the vacuum filtration method is known. These materials have excellent shielding properties, exceeding 50 dB (Science 353, 1137, 2016). The composite is conductive in the DC range.

Polymer composites with nanocarbon fillers are also known. Publication by A. Das et al. (Appl. Phys. Lett 98, 174101, 2011) refers to a polymer composite containing an admixture of carbon nanostructures having the characteristics of a hydrophobic material. The composite exhibits shielding properties at 32 dB in a narrow range of 0.57-0.63 THz. The composite contains a mixture of carbon fibres and several polymers, and it was obtained by adding a homogeneous suspension of nanostructures in acetone to the polymer mixture, and then slowly drying. The material having these shielding parameters was conductive (~$10^3$ S/m).

Use of thin layers of carbon nanotubes applied on a flexible polyethylene terephthalate (PET) substrate as a material shielding THz radiation in the range of 0.1-1.2 THz was also disclosed. This material also maintains good electrical conductivity and transparency for visible light. The material was prepared by applying nanotubes several times in a solution of ethylene dichloride on a PET substrate using a centrifuge. (Appl. Phys. Lett. 93, 231905, 2008). The material having these shielding parameters was conductive (85 Ωsq).

WO 201253063 discloses a method for preparing polymer-carbon composites containing various forms of nanocarbon, preferably carbon nanotubes. In this method, the material is prepared by preparing a pre-mix comprising from 3% to 50% by weight of carbon nanoparticles and at least one polymeric binder. To obtain the pre-mix, carbon nanoparticles and the binder are mixed until a stable polymer emulsion or suspension in the aqueous phase is obtained. If a material matrix is a thermosetting polymer, the concentrated pre-mix is dispersed in a matrix of this polymer, such as e.g.: bisphenol, epoxy resin, vinyl ester resin, unsaturated polyester, polyol, polyurethane. The polymer-specific hardener is then added to the mixture in order to obtain a finished composite material. The introduction of carbon nanotubes in form of a concentrate allows to obtain a homogeneous distribution of nanotubes in the material, and therefore better electrical conductivity. The material according to this application was characterised by properties of radiation attenuation only up to 0.1THz.

U.S. Pat. No. 8,610,617 proposes the use of individual large-format graphene layers applied one by one to an object to be protected from electromagnetic radiation in the microwave and terahertz range through its absorption. It is also disclosed that graphene can be used in form of paint or fabric and used to cover the object. The material is conductive in the DC range.

U.S. Pat. No. 9,215,835 discloses a method of protecting an object from electromagnetic radiation for frequencies higher than 1 MHz directed directly at the object, by directly covering the object with layers of graphene one by one, being in contact with each other, wherein at least one of said layers is doped with inorganic acids or/and metal salts. The proposed solution exhibits a radiation shielding ability at a level above 30 dB.

CN 103232637 discloses a conductive composite comprising 92.5-97.5 parts by weight of polypropylene, 1-3 parts by weight of graphene and 1.5-4.5 parts by weight of polypropylene grafted with maleic anhydride. The material obtained is used as a conductive material or a material shielding electromagnetic radiation.

From PL405420, a conductive (DC) panel absorbing electromagnetic radiation is known, consisting of a dielectric separator with a low relative dielectric permittivity and an inhomogeneous resistive layer. The resistive layer is formed by at least one layer of a polymer composite comprising 1-80 wt % of graphene nanoflakes with an average diameter of 2-25 μm and a thickness of up to 10 nm, applied to a thin polymer film by means of the screen printing technique.

WO2018081394A1 discloses a composite shielding against electromagnetic radiation, comprising about 5-50 wt % of matrix material having a low dielectric loss, such as, in particular, polysiloxane, but also polyethylene, polystyrene, polypropylene, poly(phenylene sulphide), polyimide, poly(ethylene terephthalate), butyl rubber, terpolymer of acrylonitrile-butadiene-styrene (ABS), polycarbonate or polyurethane, and about 50-95 wt % of copper oxide CuO particles dispersed in a matrix material. Optionally, this composite may also contain 0.1-10 wt % of electrically conductive fillers, such as, e.g. carbon black, carbon balls and foams, graphene, carbon fibres, graphite, graphite nanoplates, carbon nanotubes, metal particles and nanoparticles, metal alloy particles, metal nanowires, polyacrylonitrile fibres or particles coated with conductive material, dispersed in a matrix material. A relatively high content of CuO particles (at least 50 wt %, preferably 70 wt %) is a necessary element, while the optional addition of electrically conductive filler selected from a number of very different carbonaceous, metallic and polymeric materials does not exceed 10 wt %, and preferably it is a carbon black in an amount of 0.3 to 4 wt %. The composite is intended for shielding, mainly by absorption, of electromagnetic radiation in the range of about 0.01-100 GHz. WO2018081394A1 lacks detailed information on the type, content and form of an optional conductive additive of carbon filler other than carbon black, as well as on shielding efficiency.

CN104650498B discloses a composite in the form of a thin conductive layer, containing graphene in an amount of 0.5-5 wt % dispersed in a polymer matrix (e.g. PVC) and forming in it a spatial electrically (DC) conductive network. CN104650498B only briefly mentions the possibility of shielding electromagnetic radiation without specifying any range or determining the efficiency of shielding, or the use of any additive introducing dielectric loss unrelated to electrical conductivity.

In turn, from U.S. Pat. No. 9,252,496B2 a composition is known for dissipation of energy at least in the range of about 1-20 GHz, containing graphene in a dielectric matrix, such as a thermoplastic polymer, preferably ABS, wherein the graphene content is preferably about 5-20%, in particular 15-20% by volume of the composition. U.S. Pat. No. 9,252,496B2 contains no mention of the form of graphene used, shielding efficiency, nor the use of any additive introducing dielectric loss unrelated to electrical conductivity, nor agents allowing to control graphene dispersion in a polymer matrix.

Furthermore, CN103232637B describes a conductive nanocomposite material containing 92.5-97.5 parts by weight of polypropylene as a matrix, 1-3 parts by weight of graphene as a conductive filler and 1.5-4.5 of polypropylene grafted by maleic anhydride as a graphene dispersion promoter. CN103232637B only briefly mentions the shielding of electromagnetic radiation without specifying any range or determining the efficiency of shielding, or the use of any additive introducing dielectric loss unrelated to electrical conductivity, or the specific form of graphene used. The experimental results provided are limited solely to the study of conductivity which generally increases with the participation of graphene.

The aim of the invention was to provide a flexible and light composite material which allows shielding of electromagnetic radiation over a wide frequency range, i.e. in the microwave and terahertz range (0.3-10000 GHz) with an efficiency exceeding 10 dB (per millimetre of thickness) at least in part of this range. It was a further aim of the invention that such a composite material, by appropriately selecting a particular composition and manufacturing method, would allow to control the dominant shielding mechanism (reflection, absorption) and a particular range of shielded electromagnetic field. It was another aim of the invention that an appropriate selection of a particular composition and method of manufacturing the composite would allow to obtain a material conducting or not conducting direct current, as well as selective shielding efficiency, different in different ranges of electromagnetic radiation.

SUMMARY OF THE GIST OF THE INVENTION

The object of the invention is a composite material for shielding electromagnetic radiation, comprising:
- 88-99.88 wt % of a thermoplastic, electrically non-conductive polymer;
- 0.1-10 wt % of a nanocarbon material in form of flakes having a diameter to thickness ratio higher than 3, the thickness of the flakes not exceeding 30 nm and the diameter being of 100 nm to 5000 nm,
- 0.01-1 wt % of nanoparticles introducing a loss unrelated to electrical conductivity in a given frequency range, i.e. unrelated to the dispersion of an electromagnetic wave on free carriers,
- 0.01-1 wt % of an auxiliary material which allows to control the dispersion of the nanocarbon material and the nanoparticles in a polymer matrix and/or which can change the properties of the nanocarbon material and the nanoparticles, wherein the composite material is in form of a homogeneous mixture.

The composite material according to the invention allows to shield electromagnetic radiation with a frequency in the microwave and terahertz range (0.3-10000 GHz) with an efficiency exceeding 10 dB (per millimetre of thickness) in at least part of this range. The form of nanocarbon material—flakes having a diameter to thickness ratio higher than 3, the thickness of the flakes being not larger than 30 nm, and the diameter being of 100 to 5000 nm—provides a quasi-two-dimensional charge distribution in each nanocarbon object separately and easier formation of percolation paths in the polymer matrix which facilitate the transport of charge and heat, and allows to obtain a material conducting or not conducting direct current. Also, the specific type and proportion of nanoparticles introducing a loss unrelated to electrical conductivity in a given frequency range, and in particular having a ferromagnetic resonance frequency adequate to the band for which attenuation is to be significant, is an important parameter allowing to control the dominant shielding mechanism (reflection, absorption) and a specific range of shielded electromagnetic field, as well as selective shielding efficiency for a given radiation range.

Preferably, the thermoplastic polymer is selected from polystyrene (PS), polyethylene (PE), polypropylene (PP), polyurethane (PU), terpolymer of acrylonitrile-butadiene-styrene (ABS), a polyester such as, in particular, poly(ethylene terephthalate) (PET), poly(tetrafluoroethylene) (PTFE), polyamide (PA), terpolymer of acrylonitrile-styrene-acrylic (ASA), poly(vinyl chloride) (PVC), modified poly(phenylene ether) (MPPE), incombustible and self-extinguishing LSZH plastic (Low Smoke Zero Halogen), a derivative of one of these polymers or a combination thereof.

Preferably, the nanocarbon material is selected from flake graphene, graphene oxide, reduced graphene oxide, modified flake graphene, nanographite or a combination thereof.

Preferably, the nanoparticles are dielectric particles having a ferromagnetic resonance frequency (adequate to the band for which attenuation is to be significant) and/or an anisotropy coefficient of magnetic and/or electrical permittivity, and/or a dielectric loss for an alternating electromagnetic field (EM) resulting from the polarisation of components constituting the particle. More preferably, the nanoparticles are selected from nanoparticles of silicon carbide (SiC), aluminium oxide ($Al_2O_3$), Fe—BN, ferrite-based nanoparticles, preferably having hexagonal structure, containing cobalt or barium, or strontium, preferably $CoFe_2O_4$, $BaFei_2O_{19}$, $SrFei_2O_{19}$, $Ba_3Me_2Fe_{24}O_{41}$, $Ba_3Sr_2Fe_{24}O_{41}$, $Ba_2Co_2Fe_{12}O_{22}$, $BaCo_2Fe_{16}O_{27}$, $Ba_2Co_2Fe_{28}O_{46}$, $Ba_4Co_2Fe_{36}O_{60}$, iron-based nanoparticles, preferably Fe—Cr, Fe—Ni, Fe—Si, Fe—Co nanoparticles, or combinations thereof.

Preferably, the auxiliary material is a graphene-functionalising compound, including a plasticiser, an antioxidant, a hardener, or a combination thereof. Preferably, the plasticiser is an organic oil, an alcohol, an anhydride or a combination thereof. Preferably, the antioxidant is a natural antioxidant, preferably a carotenoid, a flavonoid, vitamin C, vitamin E, phenols or combinations thereof.

The object of the invention is also a raw material for additive manufacturing methods (commonly referred to as 3D printing) of elements for shielding electromagnetic radiation, comprising the material according to the invention as defined above, preferably in the form of a granulate, a filament or a tape.

Furthermore, the object of the invention is a product for shielding electromagnetic radiation comprising the composite material according to the invention as defined above.

In a further aspect the invention also relates to a method for preparing the product according to the invention, i.e. comprising the composite material according to the invention as defined above, said method comprising the steps of:
(i) mixing
- 88-99.88 wt % of a thermoplastic, electrically non-conductive polymer, preferably in form of grains having a size not larger than 1 mm,
- 0.1-10 wt % of a nanocarbon material in form of flakes having a diameter to thickness ratio higher than 3, the thickness of the flakes not exceeding 30 nm and the diameter being of 100 to 5000 nm,
- 0.01-1 wt % of nanoparticles introducing a loss unrelated to electrical conductivity, 0.01-1 wt % of an auxiliary material which allows to control the dispersion of the nanocarbon material and the nanoparticles in the polymer matrix and/or which can change the properties of the nanocarbon material and the nanoparticles;

(ii) injecting the molten mixture into a mould defining the product shape;

(iii) hardening the material to obtain the finished product.

Preferably, the mixing step (i) is carried out by dry mechanical mixing at room temperature. In another preferred variant, the mixing step (i) is carried out by mechanical mixing at a temperature above the polymer flow temperature.

The composite material can serve as a material protecting electronic elements, devices, modules and electronic components, electrical wires or living organisms from electromagnetic radiation in the microwave and terahertz range (0.3-10000 GHz). The elements or products shielding electromagnetic radiation from the composite material according to the invention can be manufactured by injection moulding, extrusion or 3D printing.

As mentioned above, the composite material may be non-conductive or conductive for direct current depending on the percentage composition of the fillers and the premix structure. Depending on the composition and manufacturing method, it may have selective shielding efficiency (different in different ranges), wherein control of the dominant shielding mechanism (reflection, absorption) and the range, in which the electromagnetic field is to be shielded, is carried out through appropriate selection of the composition and manufacturing method.

BRIEF DESCRIPTION OF THE DRAWINGS

The object of the invention is presented in more detail in embodiments in the drawing, in which.

DETAILED DESCRIPTION

Example 1

Two samples were made. In both samples, a thermoplastic polymer, polyethylene (PE) was used as a polymer material, and a flake graphene (2 wt %) was used as a filler. The first sample contained also maleic anhydride (1 wt %) and a negligible amount of nanoparticles based on $BaFe_{12}O_{19}$ ferrites 0.05 wt %), while the other one—maleic anhydride (a negligible amount, i.e. <0.05 wt %) and 0.5 wt % of nanoparticles based on ferrites ($BaFe_{12}O_{19}$). The materials were prepared using injection technology. Initially, a mixture of the above-mentioned components was prepared and they were mixed together mechanically, and then mixed again using a hot extruder (at a temperature above 220° C.) and thin plates having a thickness of 0.8-1 mm were formed using hot extrusion technique.

In the transmission mode, shielding efficiencies of the composites in the range of 0.1-12.5 GHz were measured (results on a logarithmic scale; the sign "-" in the graph means the weakening of the EM wave after passing through the material). Both materials had an efficiency exceeding 10 dB at least in part of the above-mentioned range.

The above example illustrates the shielding properties of the materials according to the invention for EM radiation in the microwave range.

Example 2

A thermoplastic polymer from the group of polyesters-polyethylene terephthalate (PET) was used a polymer material, and a flake graphene (2 wt %) and minimum amounts of $SrFei_2O_{19}$ nanoparticles (<0.1 wt %) and maleic anhydride (<0.1 wt %) were used as a filler, and the material was prepared by injection technology. Graphene was added to the polymer when it was in a liquid state (i.e. above 265° C.) and hot mixed using an extruder and hot extrusion technique. The material was then hot pressed into a mould, the filling of which yielded a thin plate having a thickness of about 1.8 mm, and then cooled.

Figure 1:
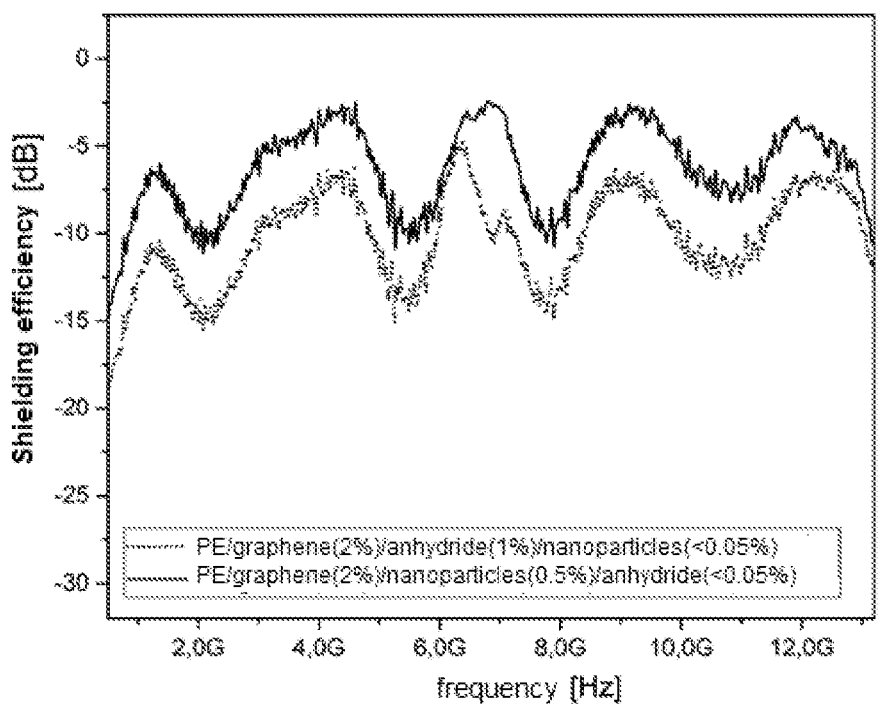
FIG. 1 shows measurement results in the transmission mode of the shielding efficiency of the composites from Example 1 in the range of 0.1-12.5 GHz (results on a logarithmic scale; the sign "-" in the graph means the weakening of the EM wave after passing through the material)
Figures 2A, 2B:
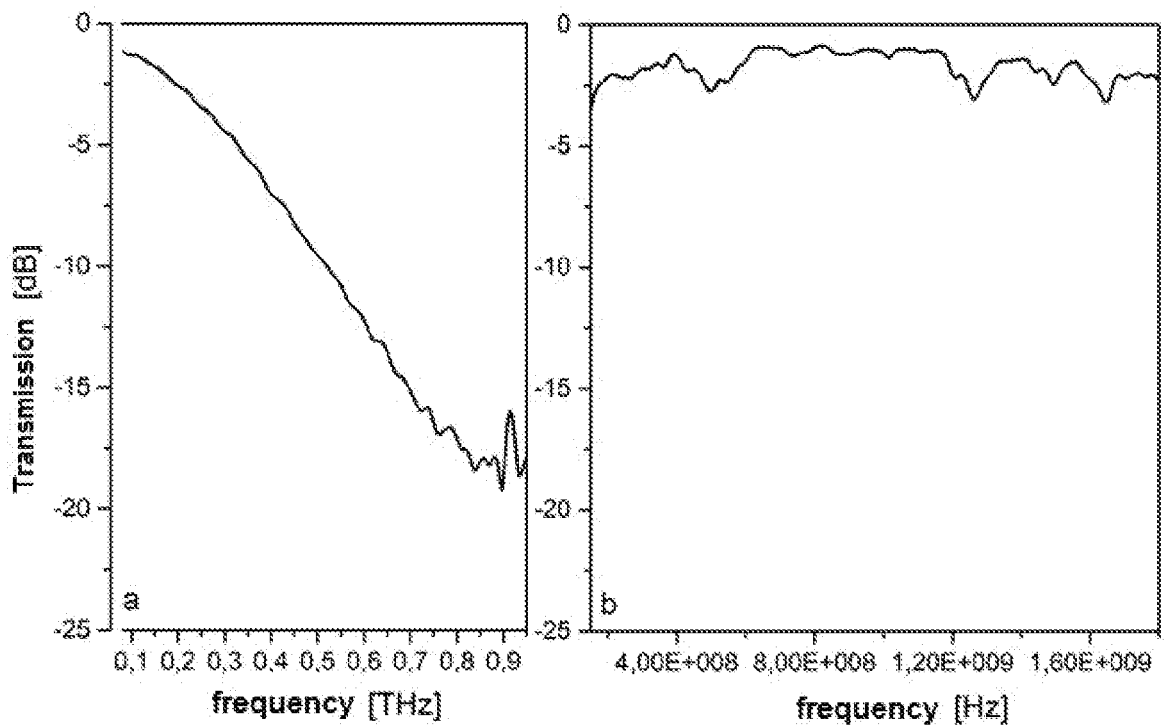
FIG. 2*a* shows the degree of weakening (logarithmic scale) of electromagnetic radiation in the range of 0.1-0.95 THz of the material from Example 2.
FIG. 2*b* shows the transmission level (logarithmic scale) of electromagnetic radiation in the range of 0.1-1.8 GHz of the material from Example 2.

Degree of weakening (logarithmic scale) of electromagnetic radiation in the range of 0.1-0.95 THz (FIG. 2*a*) was measured. Negative values of transmission were indicative of how much radiation in decibels is weakened after passing through the material. The technology of time-resolved terahertz spectroscopy was used for the tests.

Transmission level (logarithmic scale) of electromagnetic radiation in the range of 0.1-1.8 GHz was also measured (FIG. 2*b*), demonstrating that in this range the material is permeable to the above-mentioned range and thus demonstrating selectivity of shielding efficiency in various ranges.

Furthermore, the tested material did not conduct direct current (DC) and its resistivity exceeded $36.10^6$ Ω·cm.

The above example illustrates the ability of the materials according to the invention to shield EM radiation in the THz range and selectivity of shielding efficiency.

Example 3

Figure 3:
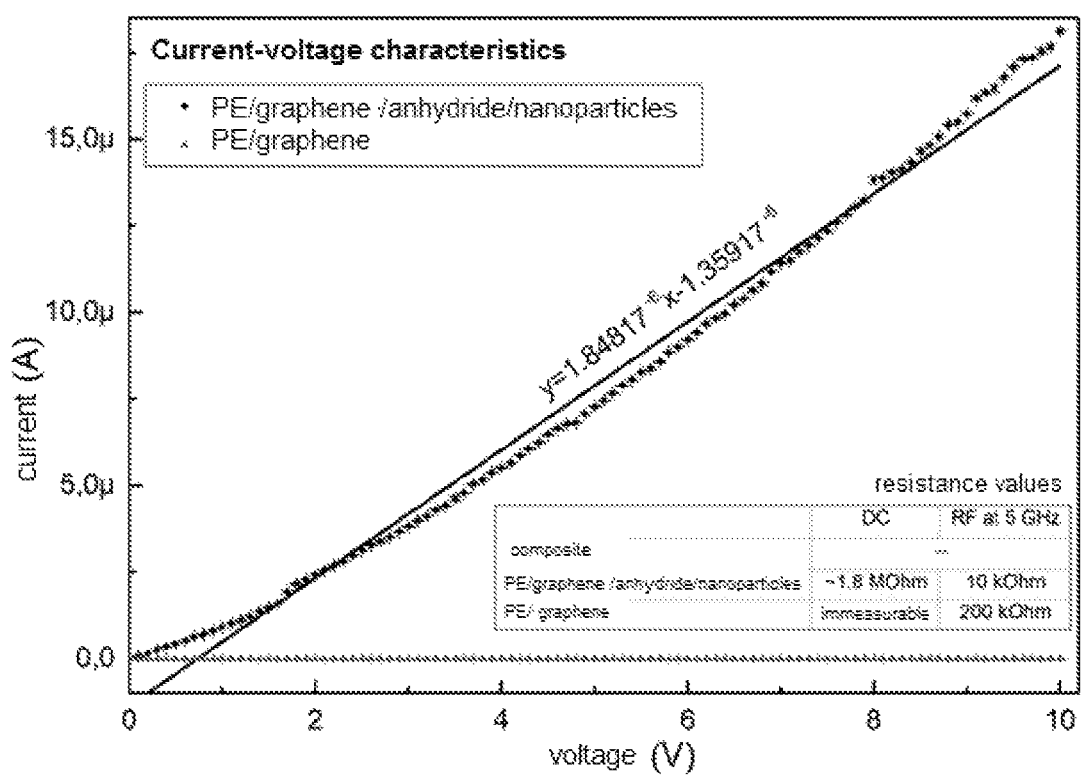
FIG. 3 shows the current-voltage characteristics for the distance of electrodes equal to 1 mm of the materials from Example 3.

A composite comprising polyethylene (PE), a filler in form of flake graphene (2 wt %), maleic anhydride (1 wt %) and a negligible amount (<0.1 wt %) of $BaFe_{12}O_{19}$ dielectric nanoparticles was obtained analogously to Example 1, producing samples in form of 1 mm thick plates. In a similar manner, samples of a comparative composite made of polyethylene and flake graphene (2 wt %) and negligible amounts of anhydride and nanoparticles (<0.05% by weight) were obtained. Electrical conductivity of both composites in various ranges was measured. In the DC range, the current-voltage characteristics for the distance of electrodes equal to 1 mm (curves in FIG. 3) was examined, from which the resistance value of a given material can be determined. In the microwave range, the resistivity per square was directly examined using a microwave resonator operating at a frequency of 5 GHz. Data from both methods are summarised in the table under the curves in the graph in FIG. 3. The data collected in this table show that the comparative composite containing PE and graphene is conductive only in the microwave range, while the composite according to the invention containing PE, graphene, maleic anhydride (and $BaFe_{12}O_{19}$ nanoparticles) is conductive over the entire measured range.

The above example illustrates that depending on the composition, the composite is conductive or non-conductive at different frequency ranges.

Example 4

A composite comprising polyethylene (PE), a filler in form of flake graphene (2 wt %) having two different diameters (5 μm and 25 μm), maleic anhydride (1 wt %) and a negligible amount (<0.1 wt %) of $BaFe_{12}O_{19}$ nanoparticles was obtained analogously to Example 1. Plates having a thickness below 1 millimetre were made from the composites, and their resistivity in various ranges was examined, as illustrated in the following table 1.

TABLE 1

Resistivity values for composite samples from Example 4

| Composite | Direct Current | Alternating Current (5 GHz) |
|---|---|---|
| With graphene flakes having a diameter of 5 μm | ~10 MOhm | 200 Ohm/sq |
| With graphene flakes having a diameter of 25 μm | non-conductive (unmeasurable) | 700 Ohm/sq |

Only the composite including flake graphene with a flake size of 5 μm is conductive in the direct current (DC) range. In turn, in the microwave (5 GHz) range, both materials are conductive.

The above example illustrates the effect of the size of graphene flakes on whether the composite material according to the invention is conductive or non-conductive at different frequency ranges.

The invention claimed is:

1. A composite material for shielding electromagnetic radiation, comprising:
    88-99.88 wt % of a thermoplastic, electrically non-conductive polymer,
    0.1-10 wt % of a nanocarbon material in form of flakes having a diameter to thickness ratio higher than 3, the thickness of the flakes not exceeding 30 nm and the diameter being of 100 to 5000 nm, wherein the nanocarbon material is selected from the group consisting of flake graphene, graphene oxide, reduced graphene oxide, modified flake graphene, nanographite, and combinations thereof,
    0.01-1 wt % of nanoparticles introducing a loss unrelated to electrical conductivity, wherein the nanoparticles are selected from the group consisting of nanoparticles of silicon carbide (SiC), nanoparticles of Fe—BN, ferrite-based nanoparticles, and combinations thereof,
    0.01-1 wt % of an auxiliary material which allows control of a dispersion of the nanocarbon material and the nanoparticles in a polymer matrix and/or which can change the properties of the nanocarbon material and the nanoparticles,
    wherein the composite material is in form of a homogeneous mixture.

2. The composite material according to claim 1, wherein the thermoplastic polymer is selected from the group consisting of polystyrene (PS), polyethylene (PE), polypropylene (PP), polyurethane (PU), terpolymer of acrylonitrile-butadiene-styrene (ABS), polyester, a derivative of one of said polymers, and combinations thereof.

3. The composite material according to claim 1, wherein the auxiliary material is a graphene-functionalizing compound.

4. The composite material according to claim 3, wherein the graphene-functionalizing compound is a plasticizer, and the plasticizer is selected from the group consisting of an organic oil, an alcohol, an anhydride, and combinations thereof.

5. The composite material according to claim 3, wherein the graphene-functionalizing compound includes an antioxidant, wherein the antioxidant is a natural antioxidant.

6. A raw material for additive methods of manufacturing elements for shielding electromagnetic radiation, comprising the composite material defined in claim 1.

7. A product for shielding electromagnetic radiation, comprising the composite material defined in claim 1.

8. The composite material according to claim 1, wherein the thermoplastic polymer is selected from the group consisting of poly(ethylene terephthalate) (PET), poly(tetrafluoroethylene) (PTFE), polyamide (PA), terpolymer of acrylonitrile-styrene-acrylic (ASA), poly(vinyl chloride) (PVC), modified poly(phenylene ether) (MPPE), and combinations thereof.

9. The composite material according to claim 1, wherein the nanoparticles are ferrite-based nanoparticles, the ferrite-based nanoparticles have a hexagonal structure, and the ferrite-based nanoparticles contain at least one of cobalt, barium, and strontium.

10. The composite material according to claim 9, wherein the ferrite-based nanoparticles are selected from the group consisting of $CoFe_2O_4$, $BaFe_{12}O_{19}$, $SrFe_{12}O_{19}$, $Ba_3Me_2Fe_{24}O_{41}$, $Ba_3Sr_2Fe_{24}O_{41}$, $Ba_2Co_2Fe_{12}O_{22}$, $BaCo_2Fe_{16}O_{27}$, $Ba_2Co_2Fe_{28}O_{46}$, $Ba_4Co_2Fe_{36}O_{60}$, and combinations thereof.

11. The composite material according to claim 3, wherein the graphene-functionalizing compound is selected from the group consisting of a plasticizer, an antioxidant, a hardener, and combinations thereof.

12. The composite material according to claim 5, wherein the natural antioxidant is selected from the group consisting of a carotenoid, a flavonoid, vitamin C, vitamin E, phenols, and combinations thereof.

13. The raw material according to claim 6, wherein the composite material is in the form of a granulate, a filament or a tape.

* * * * *